United States Patent [19]
Kawashima
[11] Patent Number: 4,644,502
[45] Date of Patent: Feb. 17, 1987

[54] SEMICONDUCTOR MEMORY DEVICE TYPICALLY USED AS A VIDEO RAM

[75] Inventor: Syoichiro Kawashima, Kanagawa, Japan
[73] Assignee: Fujitsu Limited, Kawasaki, Japan

[21] Appl. No.: 593,294
[22] Filed: Mar. 26, 1984
[30] Foreign Application Priority Data
Mar. 31, 1983 [JP] Japan ................................ 58-053632
[51] Int. Cl.[4] ......................... G11C 19/28; G09G 1/02
[52] U.S. Cl. .................................... 365/219; 365/240; 340/799; 340/800
[58] Field of Search ............... 365/189, 219, 220, 221, 365/240, 233, 230; 340/799, 800, 802, 750; 364/200 MS File, 900 MS File

[56] References Cited

U.S. PATENT DOCUMENTS 3,921,164 11/1975 Anderson ............................ 340/800
3,928,845 12/1975 Clark .................................. 340/800

*Primary Examiner*—Stuart N. Hecker
*Assistant Examiner*—Glenn A. Gossage
*Attorney, Agent, or Firm*—Staas & Halsey

[57] ABSTRACT

A semiconductor memory device used, for example, for a video RAM device which stores picture data and which is used in a video display device, etc. The semiconductor memory device includes an internal address generating circuit which sequentially generates row addresses, an address switching circuit which switches between the row address output from the internal address generating circuit and an external address, and a plurality of internal shift registers each of which stores a plurality of bit data which is read out in parallel from a memory cell array in accordance with the internal row address and/or a plurality bit data which is written-in parallel to the memory cell array in accordance with the internal row address. A serial input/output control circuit for controlling the shift registers is also provided. The input/output control circuit controls each of the shift registers so that each of the shift registers effects a shift operation to serially and continuously input or output data. When a memory cell array is not accessed by an external circuit during a time period in which a plurality of bit data is serially input or output to or from one of the plurality of shift registers, the input/output control circuit effects a parallel write-in or readout operation, in accordance with the next row address, to or from the memory cell array.

9 Claims, 10 Drawing Figures

SEMICONDUCTOR MEMORY DEVICE TYPICALLY USED AS A VIDEO RAM

BACKGROUND OF THE INVENTION

1. Field of the Invention

The present invention relates to a semiconductor memory device, and more particularly to the improvement of a semiconductor memory device such as a video random access memory (hereinafter simply referred to as video RAM) which stores picture data and which is used, for example, in a video display device or the like.

2. Description of the Prior Art

In general, a video RAM stores picture data which corresponds to a picture displayed on a video display device. The picture data in the video RAM is serially read out to display the picture, and is suitably rewritten by a random access operation of a processor. In the video RAM, therefore, a random access operation of the processor and a serial reading operation onto the video display device are effected at independent timings. Therefore, it is desired that these access operations be performed independently so as not to affect each other.

There are several known types of video RAM's in which the random access operation by the processor and the serial reading operation by the video display device can be effected independently. In one of the conventional video RAM's, the random access operation by the processor can be effected at any time. However, serial access from the video display device and the like is not allowed during the access time of the processor, and, therefore, dropout of video signals often arises, causing noise on the picture. In another type of conventional video RAM, the access time of the processor is only during each fly-back period of video signals, and no noise arises on the displayed picture. However, in this video RAM, random access by the processor is greatly limited and the processing efficiency of the processor is deteriorated. In still another type of conventional video RAM device, clock signals are supplied from the video display device, etc., to the processor and the processor can access the video RAM device only when the potential level of the clock signals is, for example, low. In this device, however, the frequency of the clock signals supplied to the processor must be adjusted to that of the clock signals of the video display device, and therefore, it is impossible to make the best use of the processing ability of the processor.

SUMMARY OF THE INVENTION

In view of the problems inherent in the above-mentioned conventional devices, the present invention adopts an idea, in a semiconductor memory device such as a video RAM which has a high-speed serial input and/or output function, of using one or more shift registers, each storing data having a plurality of bits. During a time period in which random access operation is not effected by a processor such as a CPU, a plurality of bit data read out from a memory cell block corresponding to a video address is loaded in parallel into the shift register and/or a plurality of bit data stored in the shift register is written in parallel into the memory cell block.

It is the principal object of the present invention to provide a semiconductor memory device in which data can be read out and/or written-in serially and at a high speed by supplying serial access clock signals thereto, and in which a CPU and the like can achieve random access to any address at a timing independent from that of the serial readout and/or write-in operation.

According to the present invention, there is provided a semiconductor memory device characterized in that the semiconductor memory device comprises: a memory cell array; an addressing circuit which effects an access operation to each bit of the memory cell array in accordance with an external address; an internal address generating circuit which sequentially generates row addresses; an address switching circuit which switches between the row address output from the internal address generating circuit and the external address; a plurality of shift registers each of which stores a plurality of bit data read out in parallel from the memory cell array in accordance with the row address; and a serial output control circuit which controls each of the shift registers so that each of the shift registers effects a shift operation to serially and continuously output data when the memory cell array is not accessed by an external circuit during a time period in which a plurality of bit data corresponding to a row address is serially output from one of the plurality of shift registers, the serial output control circuit effects a parallel readout operation of a plurality of bit data corresponding to the next row address from the memory cell array and loads the data thus read out to another shift register.

DESCRIPTION OF THE PREFERRED EMBODIMENTS

Before describing the preferred embodiments, an explanation will be given of conventional video RAM devices.

Figure 1:
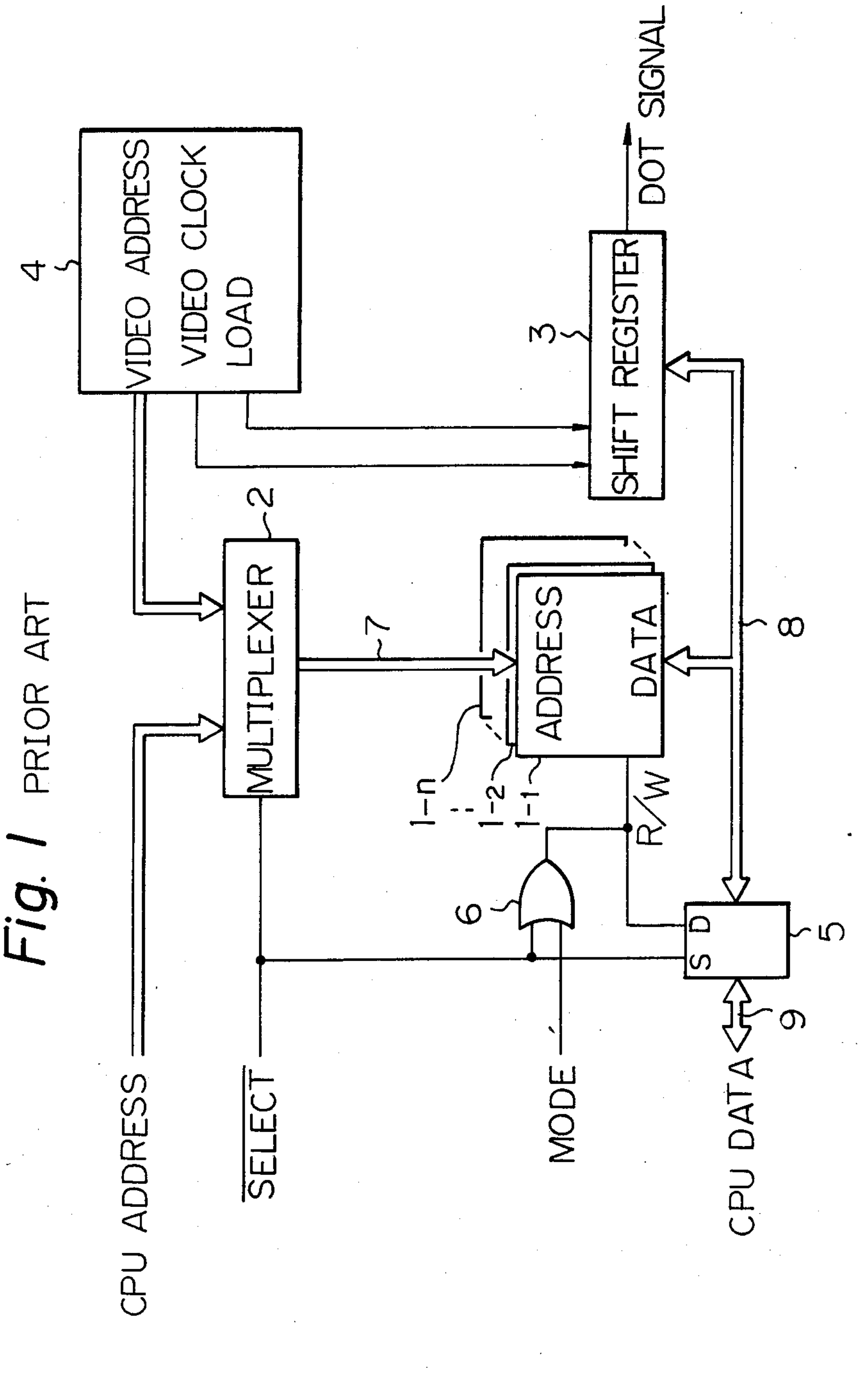
Fig. 1 PRIOR ART
FIGS. 1, 2, and 3 are block circuit diagrams of conventional video RAM's.

FIG. 1 is a block circuit diagram of a conventional video RAM which is a random access memory equipped with a serial output function. The video RAM in FIG. 1 comprises memory circuits 1-1, 1-2, —, 1-n, a multiplexer 2, a shift register 3, a video control circuit 4, a tri-state buffer 5, and an OR gate 6. Each of the memory circuits 1-1, 1-2, —, 1-n has a function to write the data one bit by one bit from a data bus 8 into a corresponding memory cell or to read the data one bit by one bit from the corresponding memory cell onto the data bus 8, in accordance with a mode designation signal R/W upon receipt of an address input from an address bus 7. The tri-state buffer 5 is responsive to a select signal applied to a terminal S, and connects the data bus 8 to a CPU data bus 9 or connects the CPU data bus 9 to the data bus 8 responsive to a direction signal D that is equivalent to a mode designation signal R/W.

In the video RAM in FIG. 1, when a select signal is not applied from a processor (CPU) or the like (not shown) to the multiplexer 2, a video address signal supplied from the video control circuit 4 is input to the memory circuits 1-1, 1-2, —, 1-n via the multiplexer 2 and the address bus 7, whereby the data having a plurality of bits is read, transferred to the shift register 3 via the data bus 8, and is loaded in parallel thereto in response to a load signal supplied from the video control circuit 4. Based upon video clock signals from the video control circuit 4, the data in the shift register 3 is shifted one bit by one bit, is output in the form of dot signals, and used for displaying pictures or the like. On the other hand, when a select signal is applied from the side of the CPU to the multiplexer 2, the address signal from the CPU is supplied to the memory circuits 1-1, 1-2, —, 1-n via the multiplexer 2 and the address bus 7, and the data is read out or written-in depending upon the mode designation signal. When the mode designation signal is, for example, a low level, a write-in operation is effected. In this case, the direction signal D of the tri-state buffer 5 also assumes a low level, the data from the CPU is transferred from the CPU data bus 9 to the data bus 8 via the tri-state buffer 5, and is input to each of the memory circuits. On the other hand, when the mode designation signal is a high level, the direction signal D of the tri-state buffer 5 assumes a high level, and the data read from each of the memory circuits is output via the data bus 8 and tri-state buffer 5 to the CPU data bus 9.

In the video RAM in FIG. 1, the CPU is allowed to effect access at any time. When the CPU has effected access, however, the video control circuit 4 is not allowed to effect access so that a video data or dot signal is not produced and noises appear on the picture.

Figure 2:
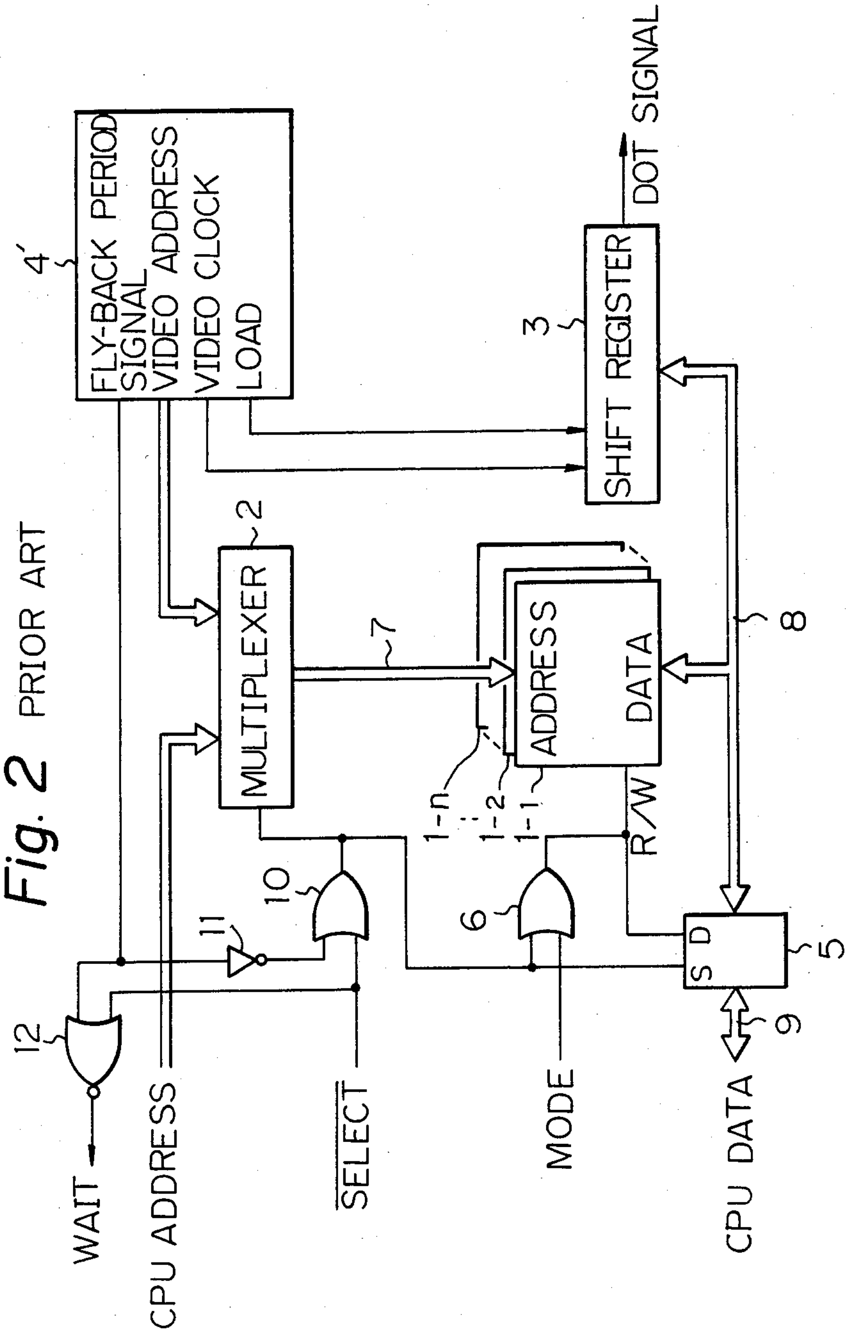
Fig. 2 PRIOR ART

FIG. 2 is a block circuit diagram of another conventional video RAM of the type in which video signals take precedence in contrast with the video RAM in FIG. 1, which is of the type in which the CPU takes precedence. Compared with the video RAM in FIG. 1, the video RAM in FIG. 2 is further provided with an OR gate 10, an inverter 11, and a NOR gate 12, and is so constructed that access can be effected by the CPU in response to a fly-back period signal from a video control circuit 4′ only during a fly-back period, i.e., only during a blanking period. That is, in a period other than the fly-back period, i.e., in a display period, the fly-back period signal of the video control circuit 4′ assumes a low level, and the output signal of the NOR gate 10 assumes a high level. Therefore, if an inverted select signal assumes a low level, the output of the NOR gate 12 assumes a high level, i.e., an access inhibit signal WAIT assumes a high level and halts the CPU to inhibit the CPU from accessing until the fly-back period. In this case, since the inverter 11 produces an output at a high level, the OR gate 10 produces an output at the high level, and the multiplexer 2 is switched to the video address side. Further, the select signal S of the tri-state buffer 5 assumes a high level, and the data bus 8 is disconnected from the CPU data bus 9. During the fly-back period, on the other hand, the fly-back period signal of the video control circuit 4′ assumes a high level, and the access inhibit signal WAIT assumes a low level, so that the CPU is allowed to effect access. Further, since the OR gate 10 produces an output at the low level, the multiplexer 2 is switched so as to connect the address signals from the CPU to the address bus 7 for memory circuits 1-1, 1-2, —, 1-n, and the tri-state buffer 5 is also placed in the selected condition.

In the video RAM in FIG. 2, the CPU effects access only during a fly-back period of the video signals, and no noise is generated in the displayed picture. However, since the CPU is allowed to effect access only during the fly-back period, a limitation is imposed on access by the CPU.

Figure 3:
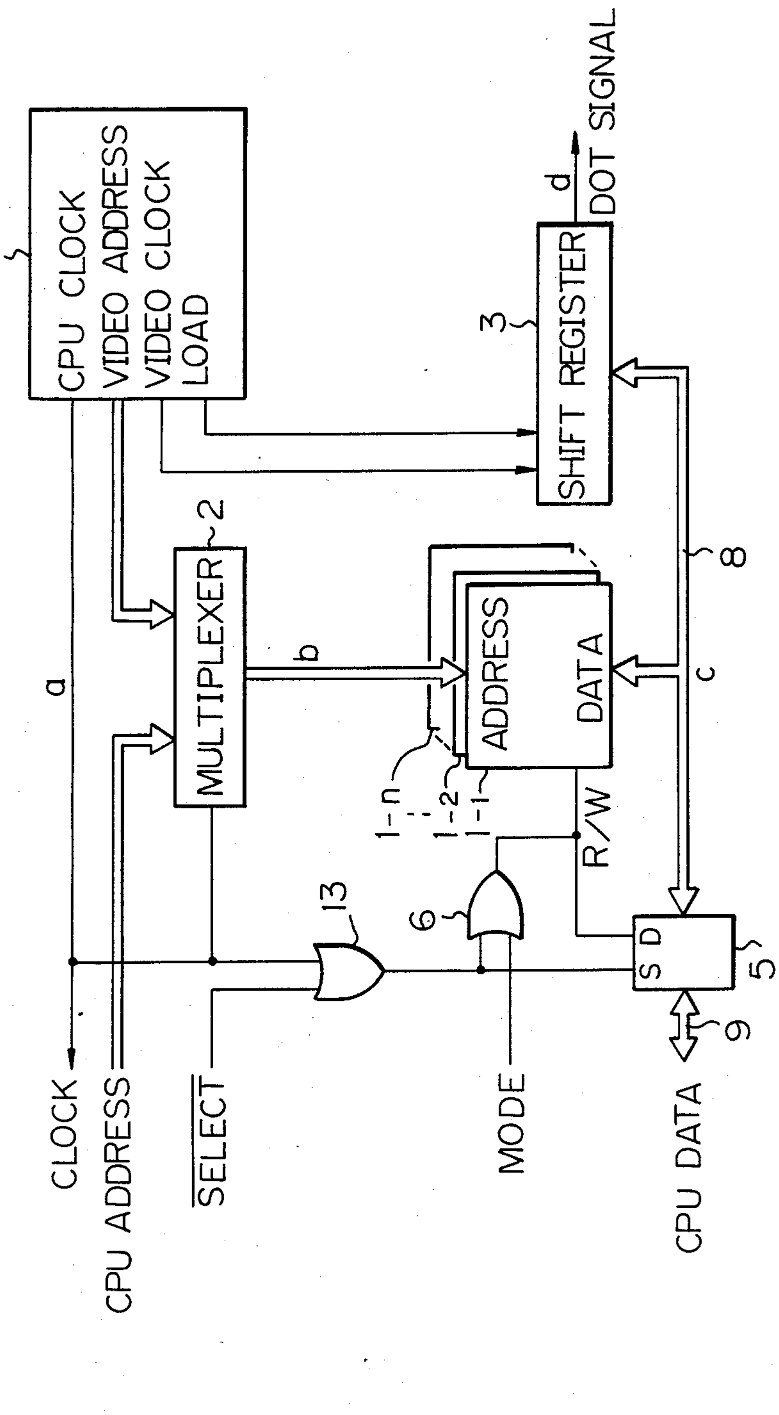
Fig. 3 PRIOR ART
Figure 4:
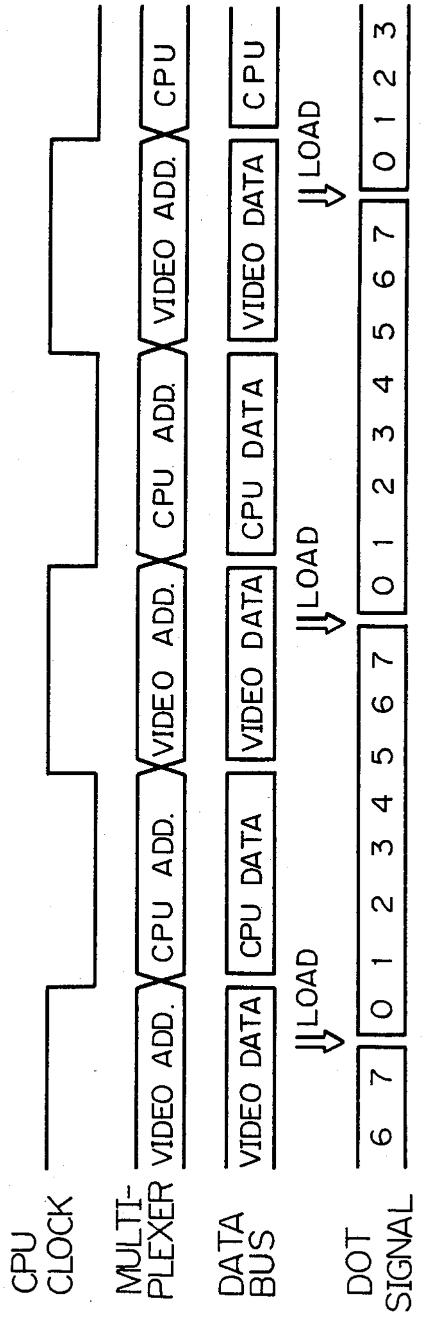
Fig. 4 PRIOR ART
FIG. 4 is a timing diagram of operation timings of the video RAM shown in FIG. 3.

FIG. 3 is a block circuit diagram of a conventional video RAM of a so-called cycle steal type. In the video RAM in FIG. 3, clock signals are supplied from the video side, i.e., from a video control circuit 4″, to the CPU side, and the CPU effects access only when the clock signals have, for example, a low level. That is, as shown in FIG. 4, when a CPU clock (point a) from the video control circuit 4″ has a low level, the multiplexer 2 is switched to the CPU address side, and address signals from the CPU are input to the memory circuits 1-1, 1-2, —, 1-n (point b). If a select signal is input from the CPU under this condition, an inverted select signal applied to one input terminal of the OR gate 13 assumes a low level, and a select signal S of the tri-state buffer 5 also assumes a low level, so that the data bus 8 is connected to the CPU data bus 9. At this moment, if a mode switching signal has a high level, the data consisting of a total of n bits is read out in parallel from each of the memory circuits 1-1, 1-2, —, 1-n, and is output to the CPU side via the data bus 8 (point c) and tri-state buffer 5, to CPU data bus 9. If the mode switching signal has a low level, the data from the CPU data bus 9 is input and written into the memory circuits via the tri-state buffer 5 and the data bus 8. On the other hand, when the CPU clock from the video control circuit 4″ has a high level, the multiplexer 2 is switched to the video address side, and video address signals are input from the video control circuit 4″ to the memory circuits. In this case, both the OR gate 13 and the OR gate 6 produce outputs at the high level, i.e., the tri-state buffer 5 disconnects the data bus 8 from the CPU data bus 9, and the memory circuits are all placed in a reading mode. Accordingly, the stored data corresponding to the video address is read out, is loaded into the shift register 3, and is serially output in the form of dot signals (point d) responsive to video clock signals.

In the video RAM in FIG. 3, no noise is generated on the displayed picture, and no limitation is imposed on access by the CPU. However, the frequency of the CPU clock signals must be brought into agreement with the frequency of the clock signals on the video side. Namely, it is not permitted to increase the frequency of the CPU clock signals, making it difficult to sufficiently utilize the processing ability of the CPU.

According to the present invention, there is provided a video RAM device which overcomes these problems.

Figure 5:
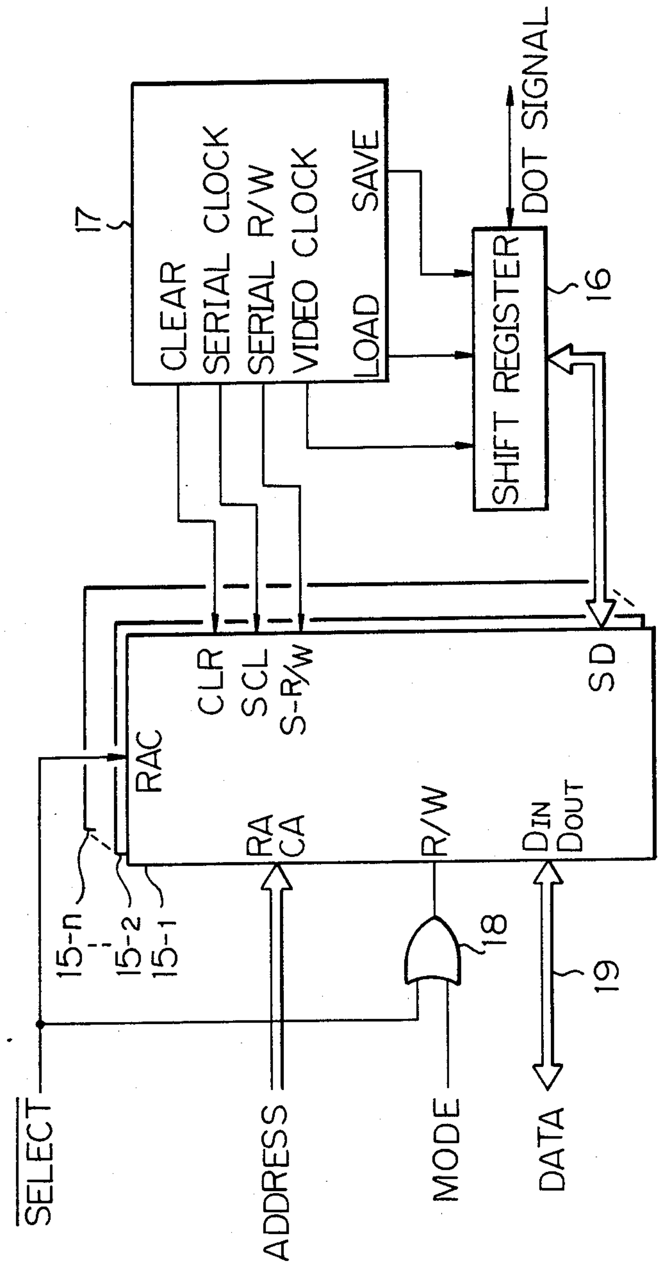
FIG. 5 is a schematic block circuit diagram of a memory device according to an embodiment of the present invention.

An embodiment of the present invention will be described below with reference to the drawings. FIG. 5 is a schematic diagram of a video RAM system, including memory circuit, that functions as a memory device according to an embodiment of the present invention. The memory system shown in FIG. 5 is comprised of a plurality of memory circuits 15-1, 15-2, —, 15-n, a shift register 16 of n bits, a video control circuit 17, and an OR gate 18. The number n of stages of the shift register 16 is selected to be, for example, 8 bits, which is equal to the number of memory circuits.

In the memory system in FIG. 5, random access can be effected from the CPU side, and serial input and output can be effected from the side of the video control circuit 17. For instance, when random access is to be effected from the CPU side, a select signal is rendered high and, hence, an inverted select signal is rendered low. The inverted select signal is applied as a random access signal RAC to the memory circuits. By applying the low level inverted select signal, the memory circuits can be accessed at random. That is, when the access is to be effected from the CPU side, an inverted select signal at the low level is produced, a row address RA and a column address CA are applied as address signals, and a mode designation signal of either the high level or the low level is produced, depending upon whether the operation is for reading or writing. When the mode designation signal at a high level is applied, the stored data of addresses designated by address signals are output in parallel onto the data bus 19, one bit by one bit, from the memory circuits 15-1, 15-2, —, 15-n. On the other hand, when the mode designation signal at a low level is applied, parallel data of n bits is written from the data bus 19 into designated addresses of the memory circuits 15-1, 15-2, —, 15-n, one bit by one bit.

Serial access can also be effected to read out and write-in serial dot signals by applying serial clock signals SCL and serial mode designation signals S-R/W from the video control circuit 17 to the memory circuits 15-1, 15-2, —, 15-n, and by applying video clock signals, load signals, and save signals to the shift register 16 at required timings.

Figure 6:
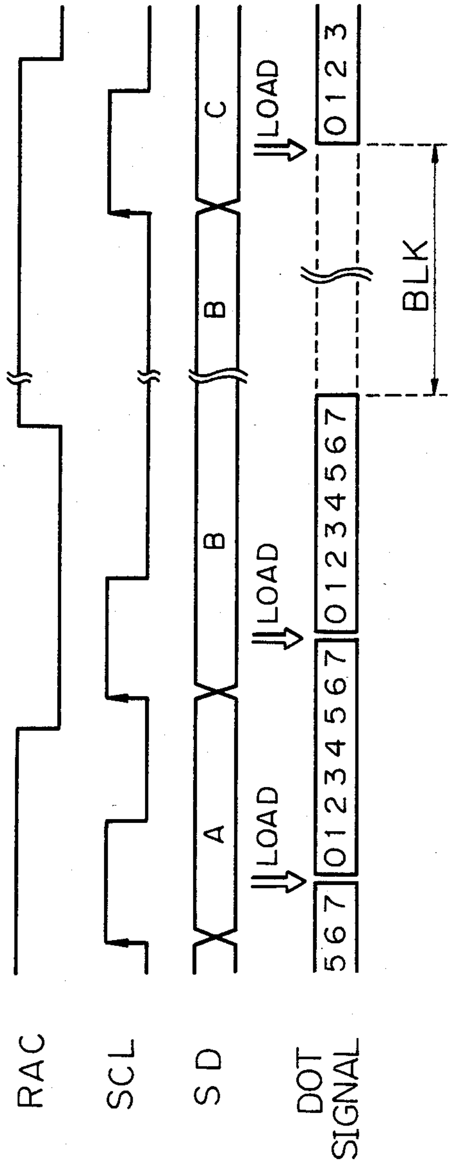
FIGS. 6 and 7 are schematic timing diagrams of operation timings of the device shown in FIG. 5.

When the data is to be serially read out, the data of 8 bits is read out one bit by one bit from each of the memory circuits 15-1, 15-2, —, 15-n, for example, at the rising edge of the serial clock signal SCL, and the data is loaded into the shift register 16. The data loaded into the shift register 16 is output therefrom in the form of dot signals, one bit by one bit, successively in response to video clock signals. The load signal will have, for example, a high level when the data read from the memory circuits is to be loaded into the shift register. The save signal is to designate the direction for shifting the data in the shift register 16. The save signal assumes a high level when the data is to be serially output, and assumes a low level when the data is to be serially input, i.e., when the data is to be written-in. Further, the frequency of the video clock signals is selected to be, for example, eight times as high as the frequency of the serial clock signals. At a moment when the data in the shift register 16 is almost output, the load signal assumes a high level, and a next serial data is loaded in parallel into the shift register 16 from the memory circuits 15-1, 15-2, —, 15-n. The thus loaded data is serially output as dot signals responsive to the video clock signals, in the same manner as described above. Since no dot signal is needed during the fly-back period, as shown in FIG. 6, the video control circuit 17 is constructed so as not to apply the serial clock signal SCL to the memory circuits during the fly-back period.

In the system shown in FIG. 5, the random access signal RAC and the serial clock signal SCL can be applied to the memory circuits 15-1, 15-2, —, 15-n at timings quite independent from each other. Therefore, random access can be effected from the CPU side, and serial input and output can be effected from the side of the video system, without affecting each other. This is because, each of the memory circuits 15-1, 15-2, —, 5-n is provided with one or more internal registers that operate as buffers to store the data consisting of a plurality of bits read out in parallel during a period in which access has not been effected by the CPU, i.e., during the period in which the random access signal is not assuming a low level. Namely, the data consisting of the plurality of bits read onto the internal registers is output, one bit by one bit, successively in response to serial clock signals SCL.

Figure 7:
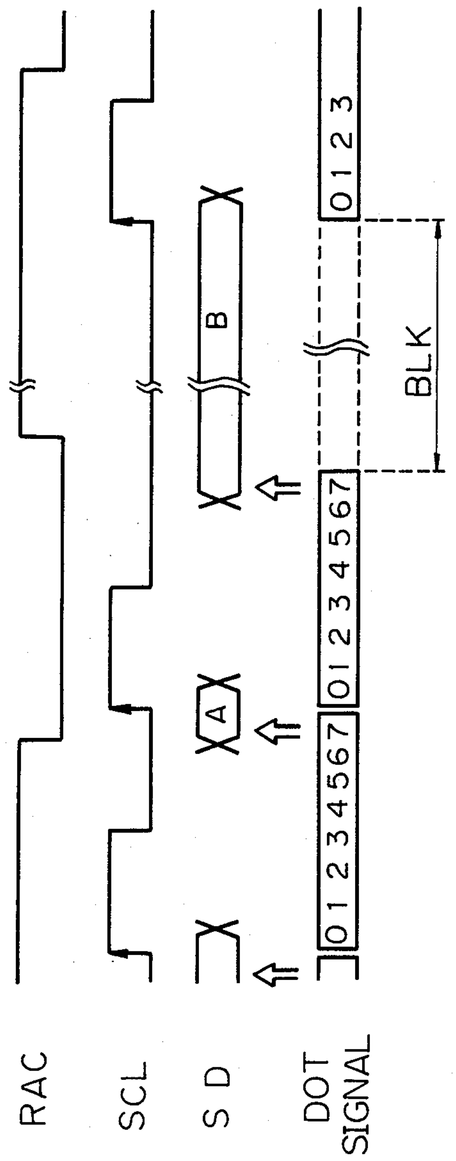

FIG. 7 is a timing diagram of the relationship of the timings when the data is serially input, i.e., when the data is written-in serially in the memory system in FIG. 5. When the data is serially input, video clock signals are applied to the shift register 16, and dot data to be written-in is serially input with the save signal maintained at a low level. Therefore, the input dot signals are successively shifted and stored in the shift register 16. When the data having n dots, e.g., 8 dots, is written-in and the dot signals are input to all the stages of the shift register 16, a serial clock signal SCL rises. Therefore, the data of n bits from every stage of the shift register 16 are input in parallel to the memory circuits 15-1, 15-2, —, 15-n. That is, each one of the n bits is input to the corresponding one of the memory circuits 15-1, 15-2, —, 15-n, and is stored in the internal shift register contained in each memory circuit. Similarly, the serial clock signal SCL rises again at a moment when the next n dot signals are input to the shift register 16, the internal shift register in each memory circuit is shifted by one stage, and the data from the shift register 16 is written into the internal shift registers in the memory circuits 15-1, 15-2, —, 15-n. Thus, the dot signals are successively stored in the internal shift registers in the memory circuits and, when the internal shift registers are filled, the data in the internal registers are written-in parallel into a memory cell block having memory cells of a plurality of bits, e.g., memory cells of one row, designated by the address counter, at a moment when the random access signal RAC no longer maintains a low level.

Figure 8A:
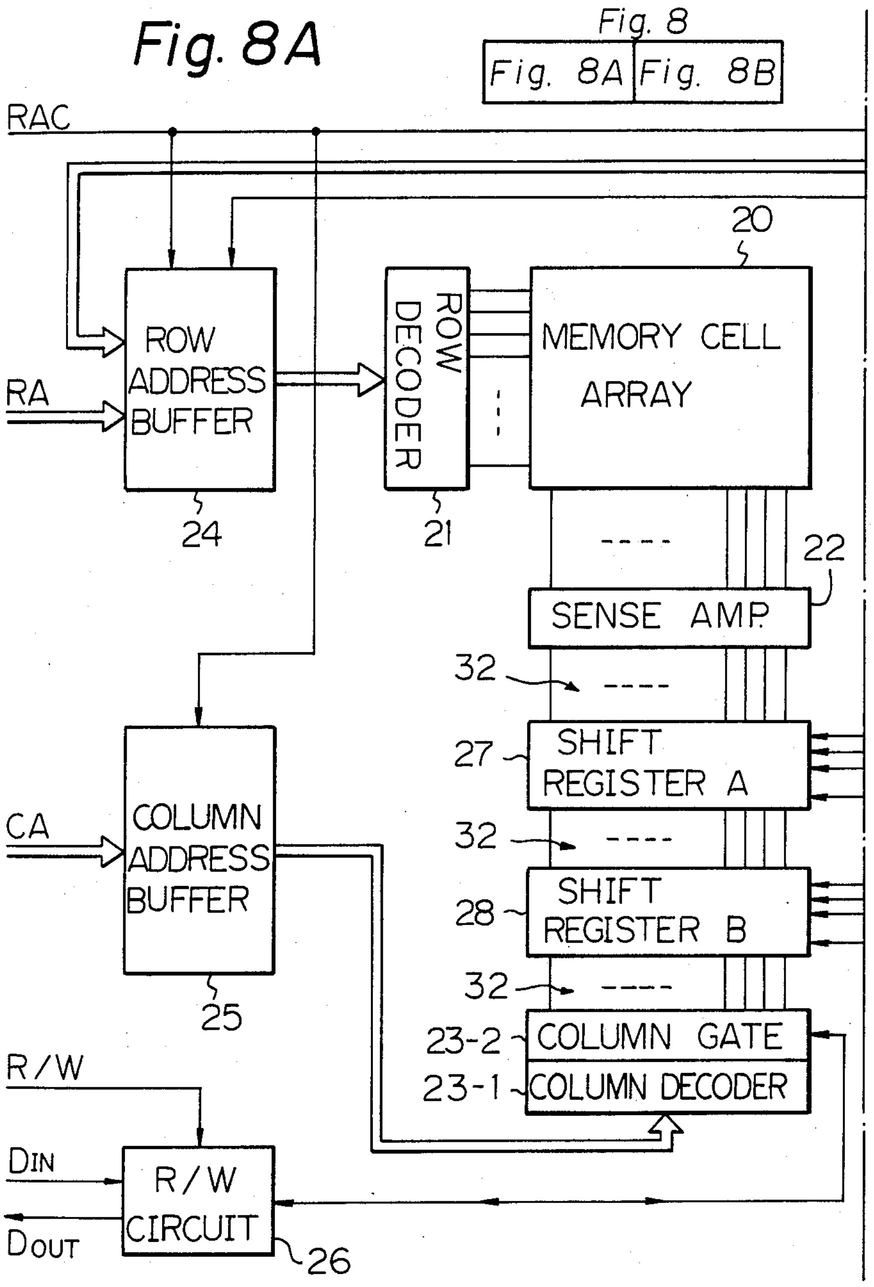
FIGS. 8 A-B are a block circuit diagram of a memory circuit employed in the memory device shown in FIG. 5.
Figure 8B:
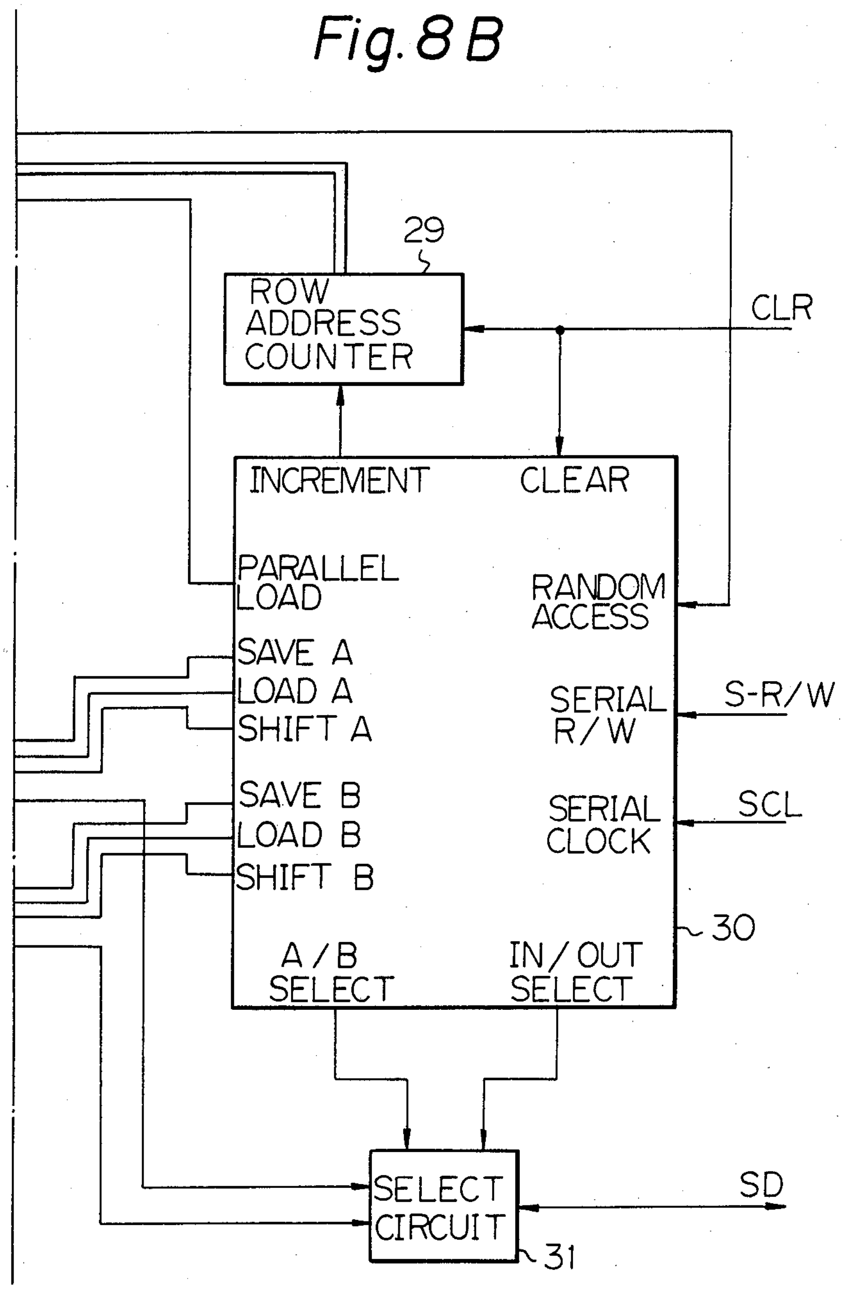

FIG. 8 is a block diagram of the internal construction of each of the memory circuits 15-1, 15-2, —, 15-n employed in the memory system in FIG. 5. The memory circuit in FIG. 8 comprises a memory cell array 20, in which memory cells are arranged in the form of, for example, a matrix, a row decoder 21, a sense amplifier 22, a column decoder 23-1, a column gate 23-2, a row address buffer 24, a column address buffer 25, a read/write circuit 26 for reading out and writing-in random access data, two internal shift registers 27 and 28 (hereinafter referred to as shift registers A and B, respectively), a row address counter 29, a serial control circuit 30, and a select circuit 31 which receives and outputs serial data. The memory cell array 20 has a number of memory cells corresponding to, for example, 128×128 bits. Therefore, the sense amplifier 22 has, for example, 128 sense amplifier units. The sense amplifier 22, the column decoder 23-1, the column gate 23-2, and the shift registers A and B are connected by a parallel data bus 32 capable of transmitting data of, for example, 128 bits in parallel. Note, the column gate 23-2 is not connected to the sense amplifier 22 via the shift registers A and B, but is directly connected to the sense amplifier 22 via the data bus 32.

Operation of the memory circuit in FIG. 8 will be described below. When a random access operation is effected by, for example, the CPU, a random access signal RAC is rendered low. This signal is the same as a chip select signal ordinarily used in the RAM. The row address buffer 24 transfers a row address RA from the CPU to the row decoder 21, and the column address buffer 25 transfers a column address CA to the column decoder 23-1. A mode designation signal R/W from the CPU is applied to the read/write circuit 26 to readout or write-in the data. When the data is to be read out, the mode designation signal R/W is rendered high, the data consisting of 128 bits of a row designated by the row decoder 21 is read out, amplified through the sense amplifier 22, and transferred to the column gate 23-2 via the parallel data bus 32. The data of one bit in a column designated by the column address CA is selected by the column decoder 23-1 and is output as a readout data $D_{OUT}$ via the read/write circuit 26. On the other hand, when the data is to be written-in, the mode designation signal R/W is rendered low, and the input data $D_{IN}$ is transmitted to the column gate 23-2 via the read/write circuit 26. The column gate 23-2 transfers the input data, via the parallel data bus 32, to a memory cell of a column designated by a column address signal CA and of a row designated by a row address signal RA.

The serial data SD, on the other hand, is written-in or read out as described below. The serial control circuit 30 counts serial clock pulses SCL, produces an increment pulse once after every, for example, 128 serial clock pulses SCL, and sends the increment pulse to the row address counter 29. The row address counter 29 counts the increment pulses, prepares a row address data for serial accessing, and sends it to the row address buffer 24. The random access signal RAC assumes a high level during a period in which accessing is not effected by the CPU, and the row address buffer 24 transfers the row address data from the row address counter 29 to the row decoder 21. Thus, each row of the memory cell array 20 is successively selected by the row address counter 29. When, for example, the data is serially read out, a serial mode designation signal S-R/W is rendered high, and the data of one row (consisting of, for example, 128 bits) is transferred from the selected row of the memory cell array 20 to the shift register A or B via the sense amplifier 22 and the parallel data bus 32. The shift registers A and B are used alternately, and a load signal A or a load signal B is applied from the serial control circuit 30 to the shift registers, so that the read data is loaded in parallel alternately to the shift registers A or B. When two internal shift registers are used, and when the load signal A is applied to the shift register A and the data is loaded in parallel thereto, the data in the shift register B is serially read out and is output as a serial data SD via the select circuit 31. When the output of data in the shift register B is finished, the data has already been loaded in parallel into, the shift register A. Therefore, as the read out of data from the shift register B is finished, the data is readily read out from the shift register A, so that the production of serial data SD will not be interrupted. When, for example, the serial data is output from the shift register B, a shift pulse B is applied to the shift register B and a save signal B is rendered low, so that the data in the shift register B is successively shifted toward the serial output terminal. In this case, a high level A/B select signal is input from the serial control circuit 30 to the select circuit 31, and the output data from the shift register B is output as a serial data SD passing through the select circuit 31. When the output of the shift register A is to be passed, the A/B select signal should be at a low level. In a readout mode, the input/output select signal is rendered high, and the data is output from the shift register A or the shift register B to an external circuit.

When the data is to be serially input, i.e., when the data is to be serially written-in, a serial mode designation signal S-R/W is rendered low, thereby an input-/output select signal is rendered low. Therefore, serial data SD from an external circuit is serially transferred, via the select circuit 31, to either the shift register A or the shift register B designated by the A/B select signal, in response to serial clock signals supplied from the external circuit. For example, when the data is transferred to the shift register A, a high level save signal A is applied from the serial control circuit 30 to the shift register A. When the data is stored, for example, in all stages of the shift register A, the data in all stages of the shift register A is written-in parallel into the selected row of the memory cell array 20 via the parallel data bus 32 and sense amplifier 22. As for the above-mentioned serial reading operation, the data in this case is also written-in during each time period in which the random access signal RAC assumes a high level, i.e., in which access is not effected by the CPU. The row onto which the data is written-in parallel is selected by supplying a row address data from the row address counter 29 to the row decoder 21 via the row address buffer 24.

Figure 9:
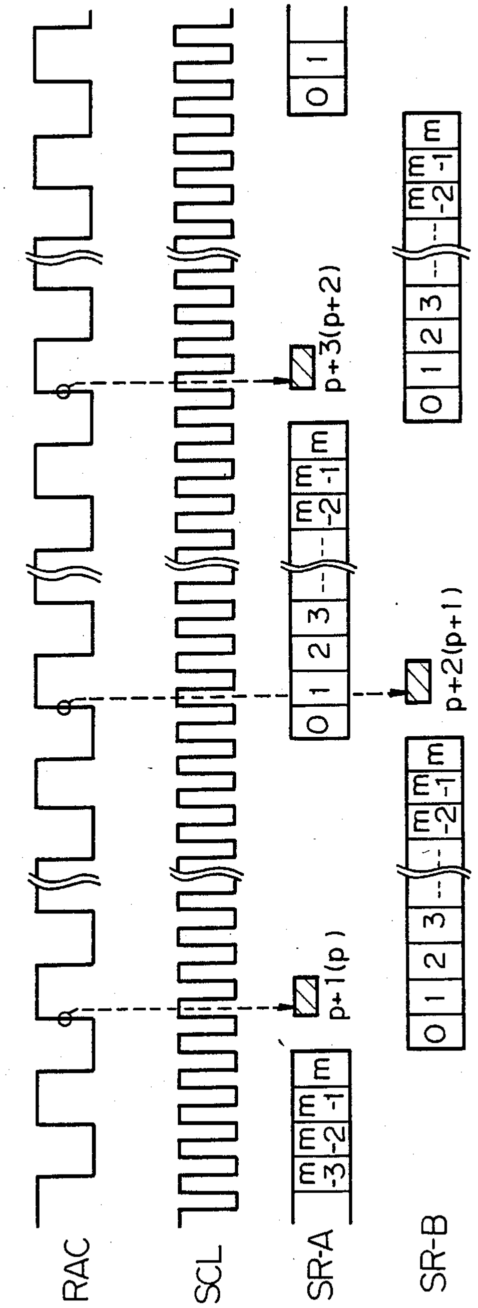
FIG. 9 is a timing chart explaining the operation of the circuit shown in FIG. 8.

FIG. 9 is a graph of the relationship of the timing between the aforementioned serial reading or writing operation and the random access operation by the CPU. As illustrated in FIG. 9, access by the CPU is effected during the time period in which a random access signal RAC is assuming a low level. The input or output operation of data between the shift register A or B for serial reading and/or writing and the selected row of the memory cell array, i.e., the selected memory cell block, is effected during the time period in which the random access signal RAC is not assuming a low level, i.e., effected after the random access signal RAC has risen. For instance, when the data of 0 to m bits are being successively read out from the shift register B in response to serial clock signals SCL, the data consisting of $m+1$ bits (for instance, $m=127$) of the $(p+1)$-th row is loaded in parallel into the shift register A. When the data is all output from the shift register B, the data of the 0 to m bits is successively output from the shift register A. During this period, data of the $(p+2)$-th row is read out and loaded into the shift register B. By using the two shift registers A and B, as mentioned above, it is possible to serially output the data without interruption even if the serial clock SCL is not synchronized with the random access signal RAC.

When the data is serially written-in, the data of the $m+1$ bits, already stored in the shift register A, are written-in parallel into the address of the p-th row during a time period in which the data is serially written into the shift register B from an external circuit in response to serial clock signals SCL, by utilizing a time period in which the random access signal RAC is not assuming a low level, i.e., by utilizing a time period in which random access is not effected by the CPU. When the data are written into all stages of the shift register B, the select circuit effects the switching so that the data is serially written into the shift register A. During the time period in which the data is serially written into the shift register A, the data in the shift register B is written into the $(p+1)$-th row by utilizing the time period in which the random access signal RAC is not assuming a low level. Thus, the input serial data is successively written into every row without interruption.

According to the present invention, as described in the foregoing, provision is made of a shift register which stores the data in parallel corresponding to a memory block including memory cells of a plurality of bits, i.e., corresponding to a row in the memory cell array. The data is transferred in parallel between the shift register and the memory cell block during the time period in which random access is not effected by the CPU, and the data in the shift register is serially input or output in response to serial clock signals. Therefore, random access can be effected by the CPU or the like to any address at any timing. Further, the data can be serially read out and written-in at high speeds and at timings quite independent of the random access operation, eliminating any affects by the random access operation and the serial access operation upon each other. By providing two or more shift registers, the serial data can be input and output without interruption.

What we claim:

1. A semiconductor memory device operatively connectable to receive an external address and operatively connectable to an external circuit, comprising:

a memory cell array accessible by the external circuit;

an addressing circuit, operatively connected to said memory cell array and operatively connectable to receive the external address, for effecting an access operation to each bit of said memory cell array in accordance with the external address;

an internal address generating circuit for sequentially generating row address outputs including a plurality of bit data;

an address switching circuit, operatively connected to said internal address generating circuit and operatively connectable to receive the external address, for switching between the row address outputs from said internal address generating circuit and the external address;

a plurality of shift registers, operatively connected to said memory cell array and said internal address generating circuit, each of said plurality of shift registers storing a plurality of bit data read out in parallel from said memory cell array in accordance with said row address outputs; and a serial control circuit, operatively connected to said plurality of shift registers, for controlling each of said plurality of shift registers so that each of said plurality of shift registers effects a shift operation to serially and continuously output data, and when said memory cell array is not accessed by the external circuit during a time period in which a plurality of bit data corresponding to one of said row address outputs is serially output from one of said plurality of shift registers, said serial control circuit effects a parallel readout operation of a plurality of bit data corresponding to a next one of said row address outputs from said memory cell array and loads the data thus read out to another one of said plurality of shift registers.

2. A semiconductor memory device according to claim 1, operatively connectable to receive a random access signal, wherein the external circuit accesses said memory cell array by using the external address and the random access signal, and wherein said address switching circuit switches between said row address outputs from said internal address generating circuit and the external address.

3. A semiconductor memory device according to claim 1, wherein the external circuit supplies serial clock signals, wherein each of said plurality of shift registers registers effects a shift operation in accordance with the serial clock signals supplied thereto from the external circuit, and wherein said serial control circuit counts the serial clock signals to generate the increment clock signals which are counted by said internal address generating circuit to generate said row address outputs.

4. A semiconductor memory device according to claim 1, wherein the external address includes an external column address data, wherein said addressing circuit comprises:

a row decoder, operatively connected to said address switching circuit, for decoding said row address outputs from said address switching circuit; and a column decoder, operatively connected to receive the external address, for decoding the external column address data included in the external address.

5. A semiconductor memory device according to claim 4, wherein the external address further includes external row address data, and wherein said semiconductor memory device further comprises:

a column address buffer operatively connected to said column decoder and operatively connected to receive the external column address data; and a row address buffer operatively connected to said row decoder and operatively connected to receive the external row address data and the row address outputs.

6. A semiconductor memory device according to claim 1, wherein said serial control circuit provides a register selecting signal and wherein said semiconductor memory device further comprises a selecting circuit, operatively connected to said shift registers, for selecting one of said plurality of shift registers in which serial data is input or output, in accordance with the register selecting signal supplied by said serial control circuit.

7. A semiconductor memory device according to claim 6, wherein said selecting circuit transmits serial output data of said selected one of said shift registers to the external circuit or transmits serial input data from the external circuit to said selected one of said shift registers.

8. A semiconductor memory device operatively connectable to receive an external address and operatively connectable to an external circuit, comprising:

a memory cell array, operatively connected to the external circuit, being accessed by the external circuit;

an addressing circuit, operatively connected to said memory cell array, for effecting an access operation to each bit of said memory cell array in accordance with the external address;

an internal address generating circuit for sequentially generating row address outputs;

an address switching circuit, operatively connected to said internal address generating circuit and operatively connectable to receive the external address, for switching between said row address outputs from said internal address generating circuit and the external address;

a plurality of shift registers, operatively connected to said memory cell array and operatively connected to said internal address generating circuit, each of said shift registers storing a plurality of bit data to be written-in parallel into said memory cell array in accordance with said row address outputs; and a serial control circuit, operatively connected to said plurality of shift registers, for controlling each of said plurality of shift registers so that each of said shift registers effects a shift operation to serially and continuously record data therein, and when said memory cell array is not accessed by the external circuit during a time period in which a plurality of bit data corresponding to one of said row address outputs is serially input into one of said plurality of shift registers from the external circuit, said serial control circuit effects a parallel write-in operation of a plurality of bit data, corresponding to a next one of said row address outputs, to said memory cell array.

9. A memory system, operatively connected to receive an external address and operatively connectable to an external circuit, for effecting random access and serial access independently, said memory system comprising:

a plurality of semiconductor memory devices providing serial output data;

an external shift register having a number of circuit stages equal to the number of said semiconductor memory devices, said memory system providing one of the operations of reading in parallel the serial output data from said semiconductor memory devices into said circuit stages of said external shift register and writing in parallel data stored in said external shift register into said semiconductor memory devices, said external shift register performing one of the operations of serially ouputting data stored therein and serially inputting data thereto, respectively;

each of said semiconductor memory devices comprising:

a memory cell array, operatively connected to the external circuit, said memory cell array being accessed by the external circuit;

an addressing circuit, operatively connected to said memory cell array, for effecting an access operation to each bit of said memory cell array in accordance with the external address;

an internal address generating circuit for sequentially generating row address outputs;

an address switching circuit, operatively connected to said internal address generating circuit and operatively connected to receive the external address, for switching between the row address outputs from said internal address generating circuit and the external address;

a plurality of shift registers, operatively connected to said memory cell array, each of said shift registers storing a plurality of bit data read out in parallel from or written into said memory cell array in accordance with said row address outputs; and a serial control circuit for controlling said shift registers, each of said shift registers performing a shift operation to serially and continuously output or write-in data, and when said memory cell array is not accessed by the external circuit during a time period in which a plurality of bit data corresponding to a row address is serially output from or written into one of said plurality of shift registers, said serial control circuit effects a parallel readout or write-in operation of a plurality of bit data corresponding to the next row address from said memory cell array or to said memory cell array, respectively.

* * * * *

UNITED STATES PATENT AND TRADEMARK OFFICE

CERTIFICATE OF CORRECTION

PATENT NO. : 4,644,502

DATED : February 17, 1987

INVENTOR(S) : Kawashima

It is certified that error appears in the above-identified patent and that said Letters Patent is hereby corrected as shown below:

Column 2, line 19, "data when" should be --data. When--; line 40, delete "a" (first occurrence); and "diagram" should be --diagrams--.

Column 4, line 58, "circuit," should be --circuits,--.
Column 7, line 51, "into," should be --into--.
Column 9, line 68, delete "registers" (second occurrence).

Signed and Sealed this

Twenty-fifth Day of August, 1987

*Attest:*

DONALD J. QUIGG

*Attesting Officer* *Commissioner of Patents and Trademarks*